US010403386B2

(12) United States Patent
Huang

(10) Patent No.: US 10,403,386 B2
(45) Date of Patent: Sep. 3, 2019

(54) METHOD FOR SCREENING BAD COLUMN IN DATA STORAGE MEDIUM

(71) Applicant: Silicon Motion, Inc., Jhubei, Hsinchu (TW)

(72) Inventor: Sheng Yuan Huang, New Taipei (TW)

(73) Assignee: Silicon Motion, Inc., Jhubei (TW)

( * ) Notice: Subject to any disclaimer, the term of this patent is extended or adjusted under 35 U.S.C. 154(b) by 107 days.

(21) Appl. No.: 15/598,239

(22) Filed: May 17, 2017

(65) Prior Publication Data
US 2017/0372797 A1 Dec. 28, 2017

(30) Foreign Application Priority Data
Jun. 24, 2016 (TW) .............................. 105119986 A

(51) Int. Cl.
G11C 29/42 (2006.01)
G11C 16/10 (2006.01)
G11C 16/26 (2006.01)
G11C 29/44 (2006.01)
G11C 16/34 (2006.01)
G11C 29/12 (2006.01)

(52) U.S. Cl.
CPC .............. *G11C 29/42* (2013.01); *G11C 16/10* (2013.01); *G11C 16/26* (2013.01); *G11C 29/44* (2013.01); *G11C 16/349* (2013.01); *G11C 2029/1204* (2013.01); *G11C 2029/4402* (2013.01)

(58) Field of Classification Search
CPC ......... G11C 16/10; G11C 16/26; G11C 29/42; G11C 2029/4402; G11C 16/349; G11C 2029/1204; G11C 29/44
See application file for complete search history.

(56) References Cited

U.S. PATENT DOCUMENTS

| 6,330,688 B1 * | 12/2001 | Brown | G06F 11/1068 365/200 |
| 2004/0085821 A1 * | 5/2004 | Kim | G11C 29/76 365/200 |
| 2005/0028052 A1 * | 2/2005 | Roohparvar | G11C 29/1201 714/710 |

(Continued)

FOREIGN PATENT DOCUMENTS

| CN | 101310342 | 11/2008 |
| TW | 200947450 | 11/2009 |

(Continued)

*Primary Examiner* — Guy J Lamarre

(57) ABSTRACT

A method for screening bad columns in a data storage medium includes steps of: writing predetermined data into at least one sample block; comparing the written data with the predetermined data to calculate numbers of error bits in the plurality of columns; defining an inspection window covering a portion of the columns; summing the numbers of error bits in the portion of columns in the inspection window to obtain a total number of error bits and determining whether the total number of error bits is greater than a number of correctable bits; if yes, determining a start point and a terminal point of a bad column interval in the inspection window, wherein the numbers of error bits in the columns between the start point and the terminal point are greater than a threshold of error bits; and labeling the columns in the bad column interval as bad columns.

19 Claims, 7 Drawing Sheets

(56) References Cited

U.S. PATENT DOCUMENTS

| | | | |
|---|---|---|---|
| 2006/0174175 A1* | 8/2006 | Huott | G01R 31/318566 714/726 |
| 2006/0181941 A1* | 8/2006 | Chang | G11C 29/24 365/200 |
| 2007/0061637 A1* | 3/2007 | Ward | G11C 29/006 714/718 |
| 2010/0125772 A1 | 5/2010 | Cheng et al. | |
| 2010/0257430 A1 | 10/2010 | Chen | |
| 2012/0297268 A1* | 11/2012 | Ishihara | G06F 11/1048 714/758 |
| 2017/0116076 A1* | 4/2017 | Sharma | G11C 29/02 |

FOREIGN PATENT DOCUMENTS

| | | |
|---|---|---|
| TW | 201019334 | 5/2010 |
| TW | 201113887 | 4/2011 |
| TW | 201611018 | 3/2016 |

\* cited by examiner

METHOD FOR SCREENING BAD COLUMN IN DATA STORAGE MEDIUM

FIELD OF THE INVENTION

The present invention relates to a data storing technology, and more particularly to a method for screening bad columns in a data storage medium.

BACKGROUND OF THE INVENTION

A data storage device, such as SSD (Solid State Drive), SD (Secure Digital) memory card or portable flash memory, is mainly constituted of a control unit and a data storage medium. The data storage medium is constituted of a plurality of data columns for storing data.

Inevitably, secondary products may be produced in the manufacturing process of data storage devices. Therefore, it is necessary to screen out all bad columns in the data storage medium and label or record the bad columns in a bad column table before releasing the secondary products to the market. According to the bad column table, the control unit is blocked from accessing the labeled bad columns so as to avoid data access error during operation.

Conventionally, the number of available labels (or records) for bad columns is limited (for example, a total of 254 labels at most). Therefore, if the data storage medium is largely defective and the available labels for bad columns are used up, some storage areas in the data storage medium having normal and valid columns would be labeled as bad storage areas as the correcting capability (e.g., 44-bit correction) of the ECC (Error Correcting Code) has been exceeded. Thus, the normal and valid data storage space is wasted and the valid capacity in the data storage medium is reduced.

SUMMARY OF THE INVENTION

One objective of the present invention is to provide a method of screening bad column in a data storage medium. In the method, the data storage space mistakenly labeled as data storage space is reserved and valid capacity in the data storage medium of the present invention is maximized.

The present invention provides a method for screening bad columns in a data storage medium. The data storage medium includes a plurality of blocks. Each of the blocks includes a plurality of columns. The method for screening bad column includes steps of: writing predetermined data into at least one sample block, wherein the at least one sample block is selected from the plurality of blocks; reading the at least one sample block to obtain written data; comparing the written data with the predetermined data to calculate a plurality of numbers of error bits in the plurality of columns in the at least one sample block; defining an inspection window covering a portion of the plurality of columns; summing the numbers of error bits in the portion of the plurality of columns covered by the inspection window to obtain a total number of error bits and determining whether the total number of error bits is greater than a number of correctable bits; if yes, determining a start point and a terminal point of a bad column interval in the inspection window, wherein the numbers of error bits in the columns between the start point and the terminal point are greater than or equal to a threshold of error bits; and labeling the columns in the bad column interval as bad columns.

The present invention further provides a method for screening bad columns in a data storage medium. The data storage medium includes a plurality of blocks. Each of the blocks includes a plurality of columns. The plurality of columns are divided into a data area and a spare area. The data area includes a plurality of segments. The method for screening bad column includes steps of: writing predetermined data into at least one sample block, wherein the at least one sample block is selected from the plurality of blocks; reading the at least one sample block to obtain written data; comparing the written data with the predetermined data to calculate a plurality of numbers of error bits in the columns in the sample block; defining an inspection window, wherein a size of the inspection window is not greater than a size of one of the segments; summing the numbers of error bits in a plurality of columns covered by the inspection window to obtain a total number of error bits and determining whether the total number of error bits is greater than a number of correctable bits; if yes, determining a start point and a terminal point of a bad column interval in the inspection window, wherein the numbers of error bits in the columns between the start point and the terminal point are greater than or equal to a threshold of error bits; labeling the columns in the bad column interval as bad columns; and shifting the inspection window.

The present invention still further provides a method for screening bad columns in a data storage medium. The data storage medium includes a plurality of blocks. Each of the blocks includes a plurality of columns. Each of the columns is for storing a plurality of bits. The method for screening bad column includes steps of: writing predetermined data into a plurality of sample blocks, wherein the sample blocks are selected from the blocks; reading the sample blocks to obtain written data; comparing the written data with the predetermined data to calculate a plurality of numbers of error bits in the columns in the sample blocks; defining an inspection window to cover a portion of the columns; summing the numbers of error bits in a plurality of columns covered by the inspection window to obtain a total number of error bits and determining whether the total number of error bits is greater than a number of correctable bits; if yes, determining a start point and a terminal point of a bad column interval in the inspection window, wherein the numbers of error bits in the columns between the start point and the terminal point are greater than or equal to a threshold of error bits; labeling the columns in the bad column interval as bad columns; and shifting the inspection window.

In summary, by employing the inspection window to determine the start point and the terminal point of the bad column interval, the method for screening bad columns of the present invention can reserve those columns which may be labeled as bad columns in the prior art; as a result, valid capacity in the data storage medium of the present invention can be maximized.

BRIEF DESCRIPTION OF THE DRAWINGS

Other advantages, objectives and features of the present invention will become apparent from the following description referring to the attached drawings.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
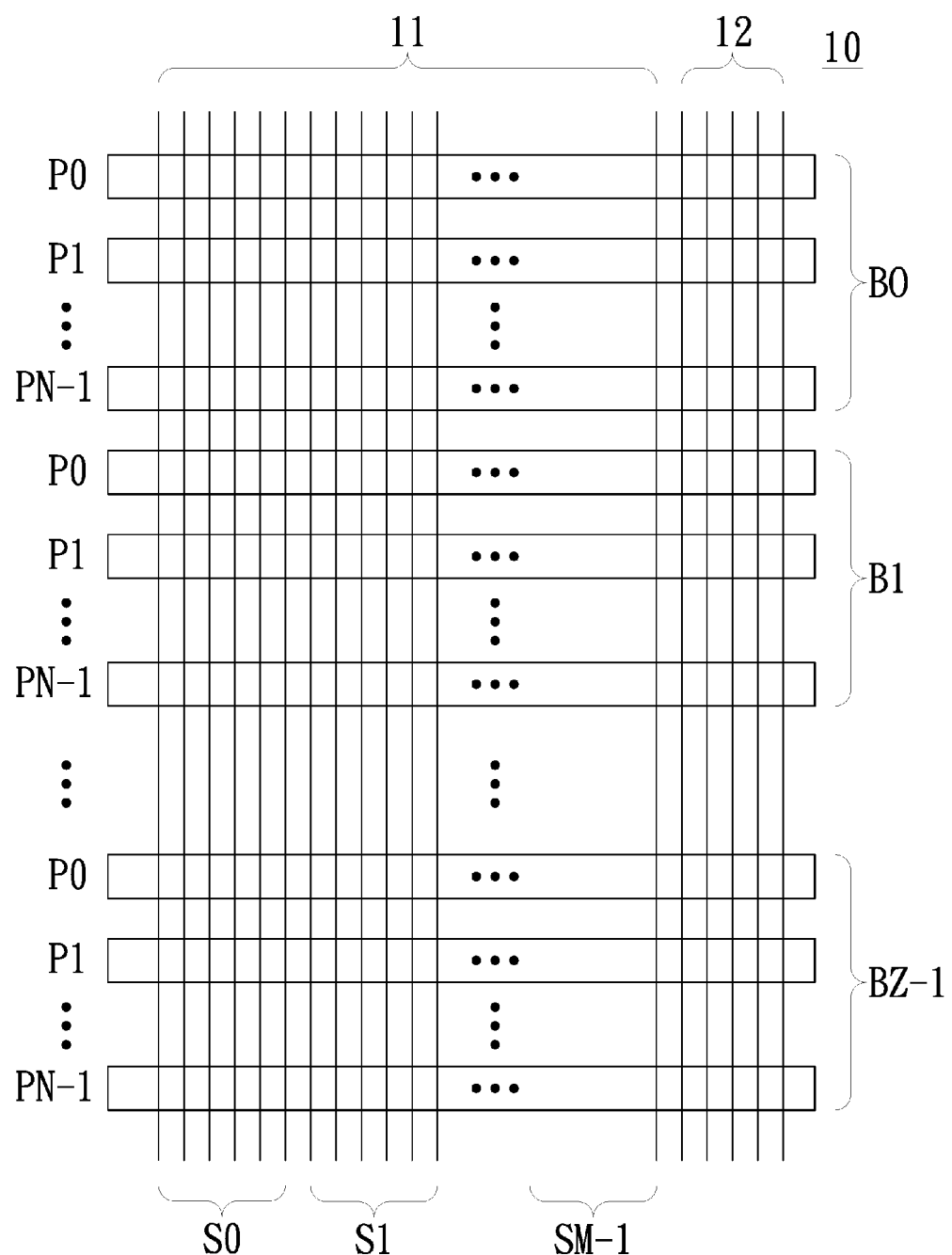
FIG. 1 is a schematic illustration of a data storage medium of a data storage device in accordance with an embodiment of the present invention.

FIG. 1 is a schematic illustration of a data storage medium of a data storage device in accordance with an embodiment of the present invention. As shown, the data storage medium 10 of the present embodiment includes Z blocks, which are blocks B0, B1, . . . , and BZ−1. In response to facilitate data logic management, the data storage medium 10 is divided into a data area 11 and a spare area 12. Both of the data area 11 and the spare area 12 include a plurality of columns for storing data and spare data (e.g., metadata) respectively. In one preferred embodiment, each column can store 8-bit data. Further, the columns arranged in the same row constitute a page. Each block includes N pages, which are pages P0, P1, . . . , and PN−1. Each page includes some columns in the data area 11 and some columns in the spare area 12. According to the user's needs, the columns in the data area 11 can be divided into M segments, which are segments S0, S1, . . . , and SM−1. Each segment includes Y columns. In one preferred embodiment, the size of each segment is equal to the size of one record of data unit plus the size of an ECC (Error Correcting Code); and therefore, each record of data and the respective ECC can be written into one segment properly and thereby facilitating the locating and correcting of the error data in the segment. The total number of the columns in the data area 11 is divisible by M. Further, in one preferred embodiment, the data area 11 is located at the front end of the respective page and the spare area 12 is located at the rear end of the respective page; and the segment S0 is located at the front end of the respective data area 11 and the segment SM−1 is located at the rear end of the respective data area 11. In the present embodiment, the aforementioned M, N, Y, and Z are positive integers. Further, in the present embodiment, the data storage medium 10 may be a nonvolatile memory, such as a flash memory, MRAM (magnetic RAM), FRAM (ferroelectric RAM), PCM (phase change memory), STTRAM (spin-transfer torque RAM), ReRAM (resistive RAM), Memristor or other memory device suitable for long-term data storage.

Due to bad columns may exist in the data storage medium 10, in one embodiment a method for screening bad columns in a data storage medium of the present invention is adopted first for determining and recording the bad columns in the data storage medium 10 and then the data storage medium 10 is divided into the data area 11 and the spare area 12 as illustrated in FIG. 1 (hereunder is referred as the first way of data division). That is, the data storage medium 10 is divided into the data area 11 and the spare area 12 after the positions of bad columns in the data storage medium 10 are determined. It is understood that the division of the data area 11 and the spare area 12 is based on the logical partition of data management; therefore, in another embodiment the data storage medium 10 is divided into the data area 11 and the spare area 12 first, then the method for screening bad columns of the present invention is adopted for determining and recording the bad columns in the data storage medium 10, and then the division of the data area 11 and the spare area 12 is adjusted (hereunder is referred as the second way of data division). The aforementioned two ways of data division have the similar implements and but slight difference in executing sequence of steps. In order to simplify the explanation of the present invention, the first way of data division is adopted for the explanation of the present invention, but the present invention is not limited thereto.

In order to improve the efficiency of screening bad columns, preferably, a portion of the blocks in the data storage medium 10 are selected randomly as sample blocks for executing the method for screening bad columns of the present invention; however, the present invention is not limited thereto. Hereunder the description of the present invention is based on selecting blocks B0 and B1 as the sample blocks.

Figure 2:
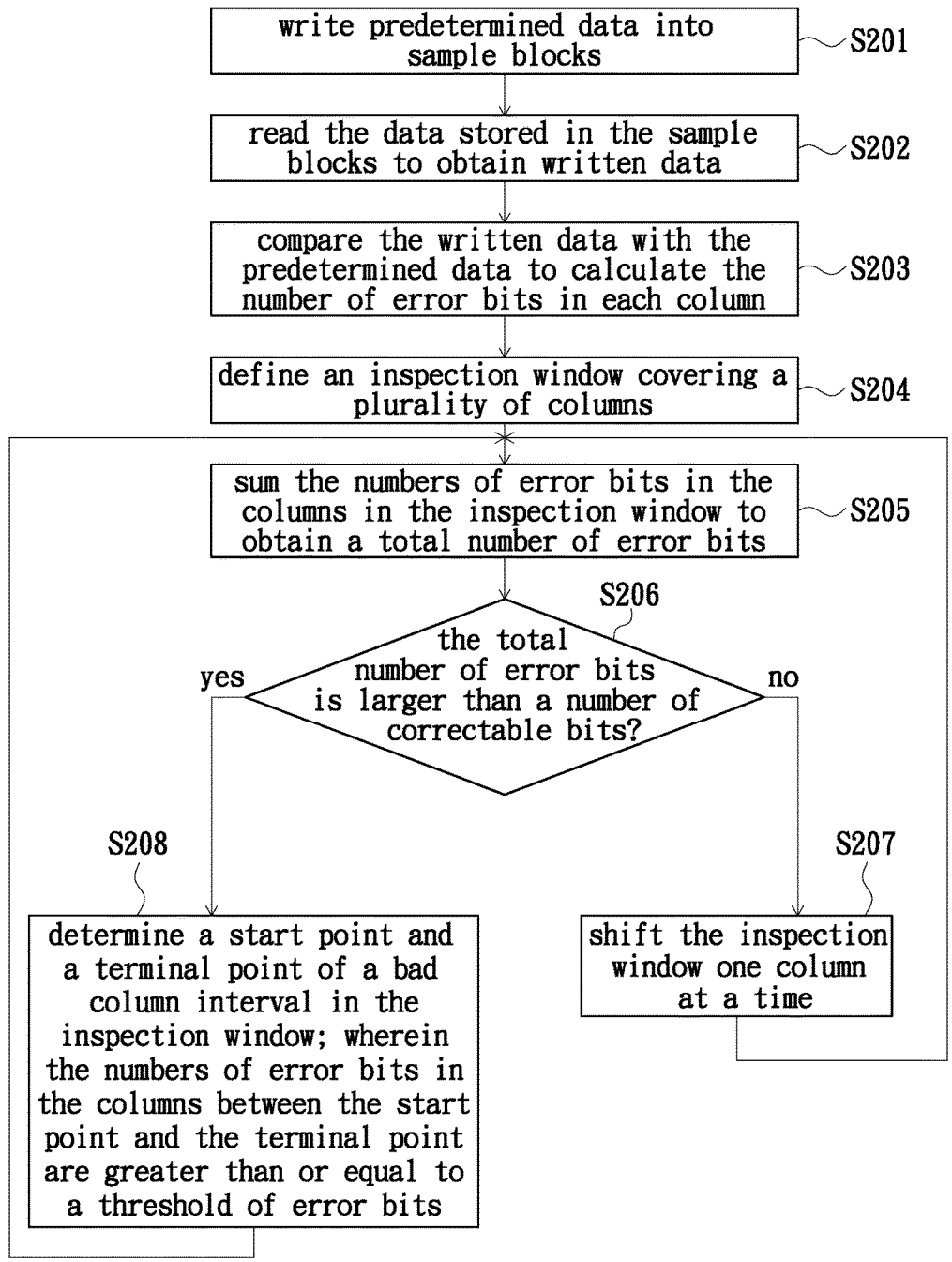
FIG. 2 is a flowchart of a method for screening bad columns in accordance with an embodiment of the present invention.

FIG. 2 is a flowchart of a method for screening bad columns in accordance with an embodiment of the present invention. Please refer to FIGS. 1 and 2 together. First, step S201: writing predetermined data into the sample blocks. In the present embodiment, because of the blocks B0 and B1 are selected as the sample blocks, step S201 is for writing the predetermined data into the blocks B0 and B1; and more specifically, step S201 is for writing the predetermined data into the pages P0, P1, . . . , and PN−1 in the blocks B0 and B1. Thereafter, step S202: reading the data stored in the sample blocks to obtain written data. In the present embodiment, for example, step S202 is for reading the data stored in the blocks P0, P1, . . . , and PN−1 in the blocks B0 and B1 to obtain the written data. Thereafter, step S203: comparing the written data with the predetermined data to calculate the number of error bits in each column in the sample blocks. In the present embodiment, for example, step S203 is for comparing the written data with the predetermined data to calculate the number of error bits in each column in the blocks B0 and B1. Please be noted that a user can decide to write the predetermined data into certain pages of the sample blocks. This decision reduces a number of samples but hastens the process of the present invention, so it is still an option to the user.

Figure 3:
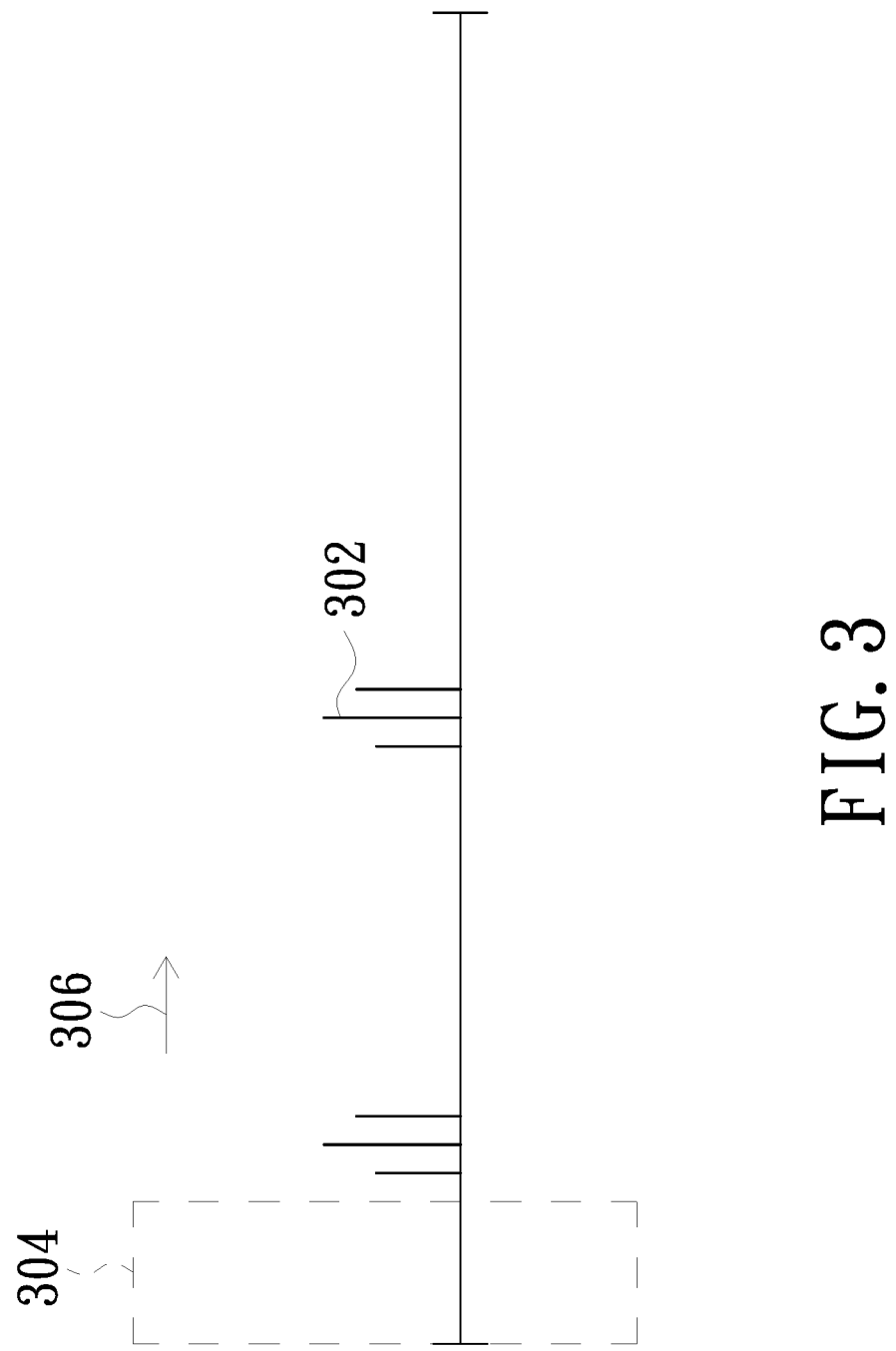
FIG. 3 is a schematic illustration of another exemplary distribution of a portion of bad data columns.

FIG. 3 is a schematic illustration of an exemplary distribution of a portion of bad data columns. In FIG. 3, each vertical line represents a column (e.g., one vertical line represents the column 302) and the length of each vertical line represents the number of error bits in the respective column in the blocks B0 and B1, wherein the length of each vertical line is proportional to the number of bit errors in the respective column. To simply the description of the present invention, the vertical lines are omitted in FIG. 3 if having the number of error bits lower than a threshold and thereby focusing the method for screening bad columns of the present invention only on the columns having the number of error bits greater than the threshold; wherein the threshold is an adjustable positive integer. As illustrated in FIG. 3, there are six columns in the blocks B0 and B1 having relatively-large numbers of error bits. Specifically, wherein three columns are located at the front end of the respective page; the other three columns are located at the middle of the respective page; and the remaining columns having relatively-small numbers of error bits are not shown.

Figure 4:
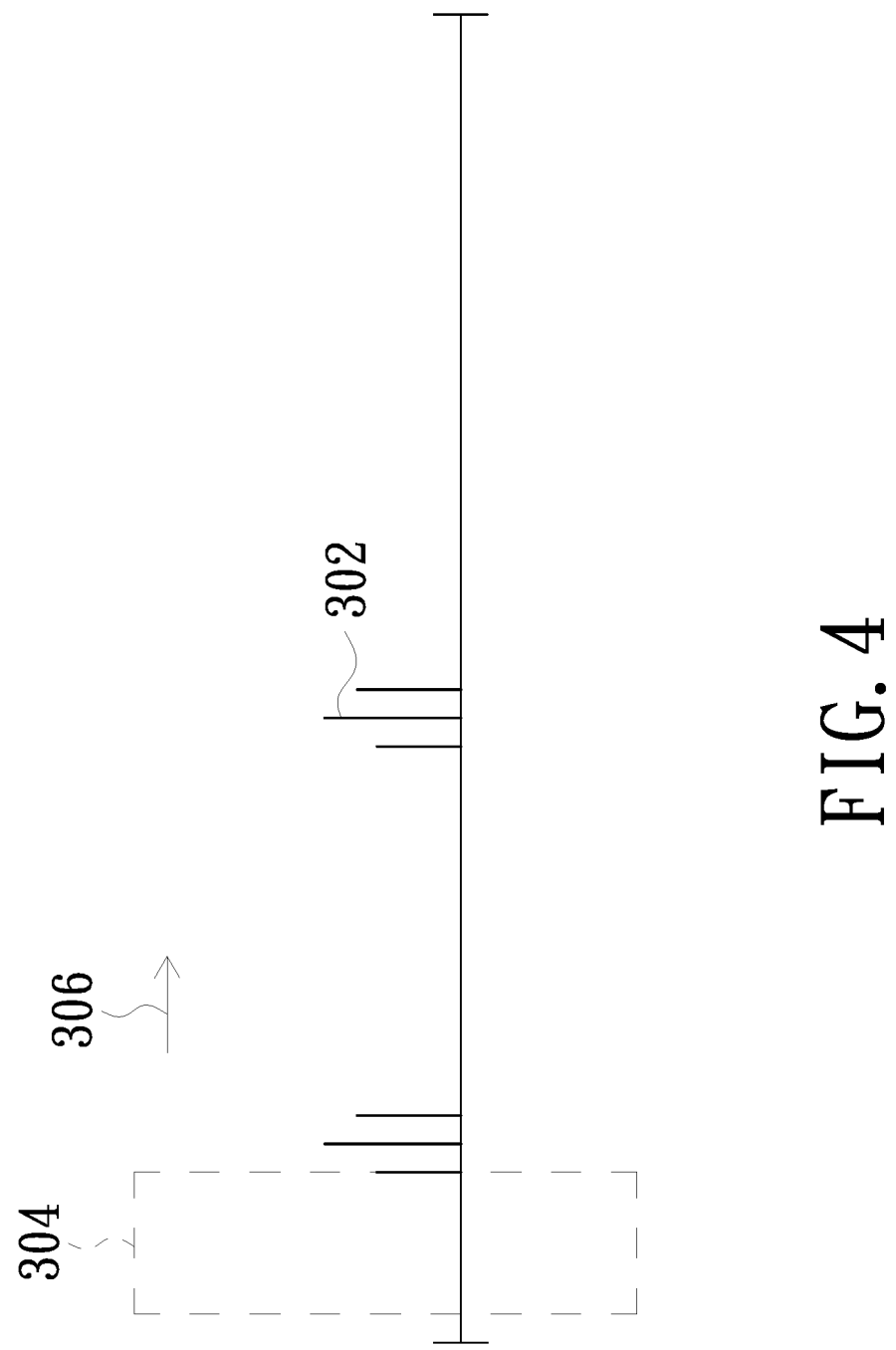
FIG. 4 is a schematic illustration of another exemplary distribution of a portion of bad data columns.

Please refer to FIGS. 2 and 3 together. Thereafter, step S204: defining an inspection window covering a plurality of columns in the sample blocks. In one preferred embodiment, the size of the inspection window is equal to that of a segment, but the present invention is not limited thereto. In the present embodiment as shown in FIG. 3, the size of the inspection window (e.g., the inspection window 304) is equal to five columns (i.e., Y=5). Thereafter, step S205, summing the numbers of error bits of the columns in the inspection window to obtain a total number of error bits. In the present embodiment, for example, step S205 is for summing the numbers of error bits in the five columns in the inspection window 304 to obtain the total number of error bits. Thereafter, step S206: determining whether the total number of error bits is greater than a number of correctable bits. In the present embodiment, preferably, the number of correctable bits is not greater than the maximum number of error bits able to be corrected by ECC (e.g., 44 bits). As shown in FIG. 3, because of the all five columns in the current inspection window 304 have relatively-small numbers of error bits, the determination result obtained in step S206 is no and step S207 is then performed accordingly. Thereafter, step S207: shifting the inspection window one column at a time in a first direction. In the present embodiment, for example, step S207 is for shifting the inspection window 304 by one column in a direction toward the rear end of the page (i.e., the direction 306 in FIG. 3). FIG. 4 is a schematic illustration of an exemplary distribution of a portion of bad data columns derived from FIG. 3 after the inspection window 304 has one column shift in a direction toward the rear end of the page. Step S205 is then performed once step S207 is completed.

In another embodiment, the inspection window 304 is located at the rear end of the page initially and shifted column by column in a direction toward the front end of the page (i.e., the direction opposite to the direction 306). The present embodiment and the previous embodiment are similar. A difference lies in the initial position and the shifting direction of the inspection window 304; and therefore, no redundant detail is to be given herein. In another embodiment, the inspection window 304 is located at the middle of the page initially and shifted column by column in a direction toward the front end of the page and then shifted column by column in a direction toward the rear end of the page. The present embodiment and the previous two embodiments are similar. A difference lies in the initial position and the shifting direction of the inspection window 304; and therefore, no redundant detail is to be given herein.

Figure 5:
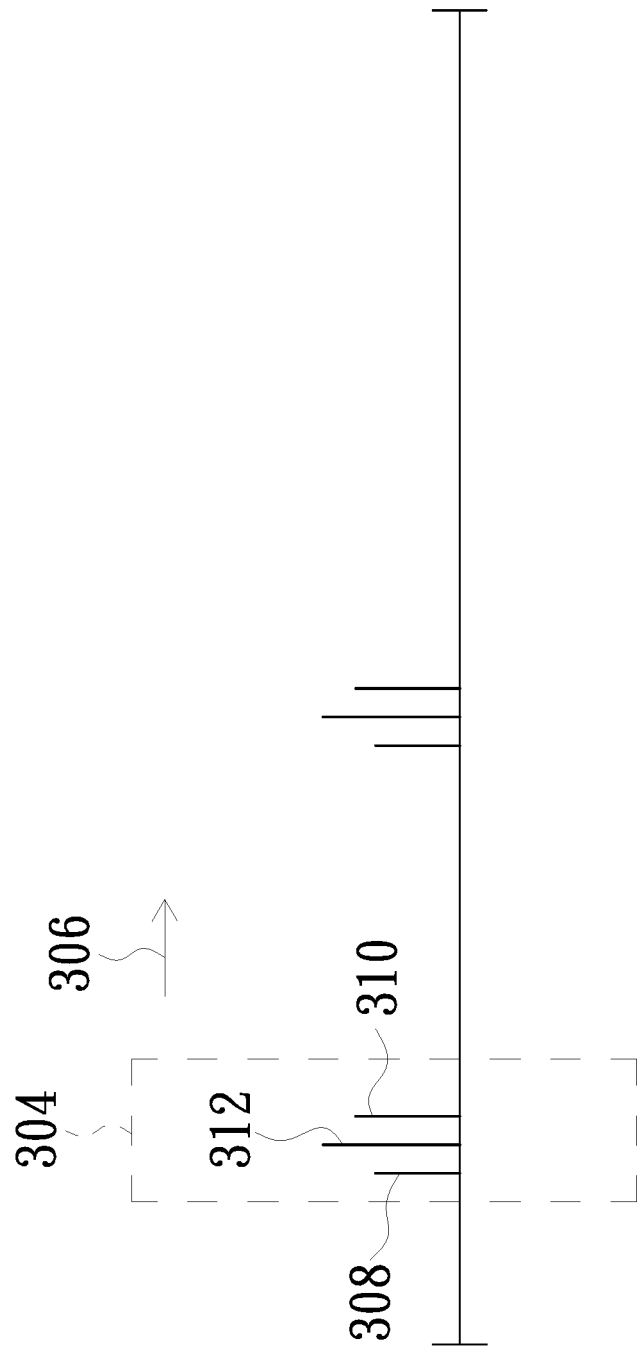
FIG. 5 is a schematic illustration of another exemplary distribution of a portion of bad data columns.

When the determination result obtained in step S206 is yes, step S208 is then performed accordingly. Thereafter, step S208: determining a start point and a terminal point of a bad column interval in the inspection window; wherein the numbers of error bits of the columns between the start point and the terminal point of the bad column interval are greater than or equal to a threshold of error bits. It is understood that the total number of error bits of the inspection window 304 may be greater than 44 bits while the inspection window 304 is shifted column by column in the direction toward the rear end of the page, such as the illustration of FIG. 5. As shown in FIG. 5, because of the total number of error bits in the current inspection window 304 is greater than the number of correctable bits (e.g., 44 bits), the determination result obtained in step S206 is yes and step S207 is performed for determining the start point and the terminal point of the bad column interval in the inspection window 304. Specifically, step S208 first determines the start point of the bad column interval; that is, step S208 determines whether the number of error bits of the column is greater than or equal to the threshold of error bits (e.g., the threshold of error bits is 5) column by column from the front end to the rear end of the inspection window 304. In one preferred embodiment, the threshold of error bits relates to the maximum number of correctable error bits of the ECC; for example, the threshold of error bits relates to the bit correcting capability of the ECC and has a value not greater than the maximum number of correctable bits. In one preferred embodiment, the threshold of error bits is equal to 10% of the maximum number of correctable bits. The first column having the number of error bits greater than or equal to the threshold of error bits in the inspection window 304 (e.g., the column 308) is determined as the start point of the bad column interval. Thereafter, step S208 determines the terminal point of the bad column interval; that is, step S208 determines whether the number of error bits of the column is greater than or equal to the threshold of error bits (e.g., the threshold of error bits is 5) column by column from the rear end to the front end of the inspection window 304. The first column having the number of error bits greater than or equal to the threshold of error bits in the inspection window 304 (e.g., the column 310) is determined as the terminal point of the bad column interval. In some special circumstances, the start point and the terminal point may be the same column in the bad column interval when it is determined that there is only one column in the inspection window 304 having the number of error bits greater than or equal to the threshold of error bits.

In the inspection window 304 as shown in FIG. 5, the start point of the bad column interval is the column 308, the terminal point of the bad column interval is the column 310, and any column located between the start point and the terminal point of the bad column interval (e.g. the column 312) is referred as a bad column. Namely, the bad column interval in the inspection window 304 in FIG. 5 includes three bad columns; therefore, it is selective to label the columns 308, 310 and 312 as a bad column interval or individually label each of the columns 308, 310 and 312 as a bad column. Once the bad column interval is labeled, a control unit of the data storage device is configured not to access the columns in the bad column interval. For example, as illustrated in FIG. 5, if each segment has five columns and the columns 308, 310 and 312 are located in the same segment, there are still two columns can be accessed in the segment due to that only the three columns 308, 310 and 312 are labeled as bad columns. Therefore, compared with the prior art which directly labels the whole segment including the columns 308, 310 and 312 as a bad segment and the control unit will not access all of the columns in the bad segment, the method for screening bad columns of the present invention can reserve those columns which may be labeled as bad columns in prior art and the available capacity in the data storage medium 10 can be maximized accordingly.

In another embodiment, the rear end of the inspection window 304 may be preset as the terminal point of the bad column interval; and therefore, step S208 is simplified as: determining the start point of the bad column interval in the inspection window. Because of the determination result obtained in step S206 is turned to yes by shifting the inspection window 304 column by column in a direction toward the rear end of the page, the column at the rear end of the inspection window 304 may be the main reason resulting in turning the determination result obtained in step S206 to yes and therefore it is reasonable to preset the rear end of the inspection window 304 as the terminal point of the bad column interval. As a result, the method for screening bad columns of the present invention can be performed more efficiently due to the process of step S208 is simplified. In another embodiment, the front end of the inspection window 304 may be preset as the start point of the bad column interval; and therefore, step S208 is simplified as: determining the terminal point of the bad column interval in the inspection window. Because of the determination result obtained in step S206 is turned to yes by shifting the inspection window 304 column by column in a direction toward the rear end of the page, the column at the front end of the inspection window 304 may be the main reason resulting in turning the determination result obtained in step S206 to yes and therefore it is reasonable to preset the start end of the inspection window 304 as the start point of the bad column interval. As a result, the method for screening bad columns of the present invention can be performed more efficiently due to the process of step S208 is simplified. Step S205 is then performed once step S208 is completed.

Figure 6:
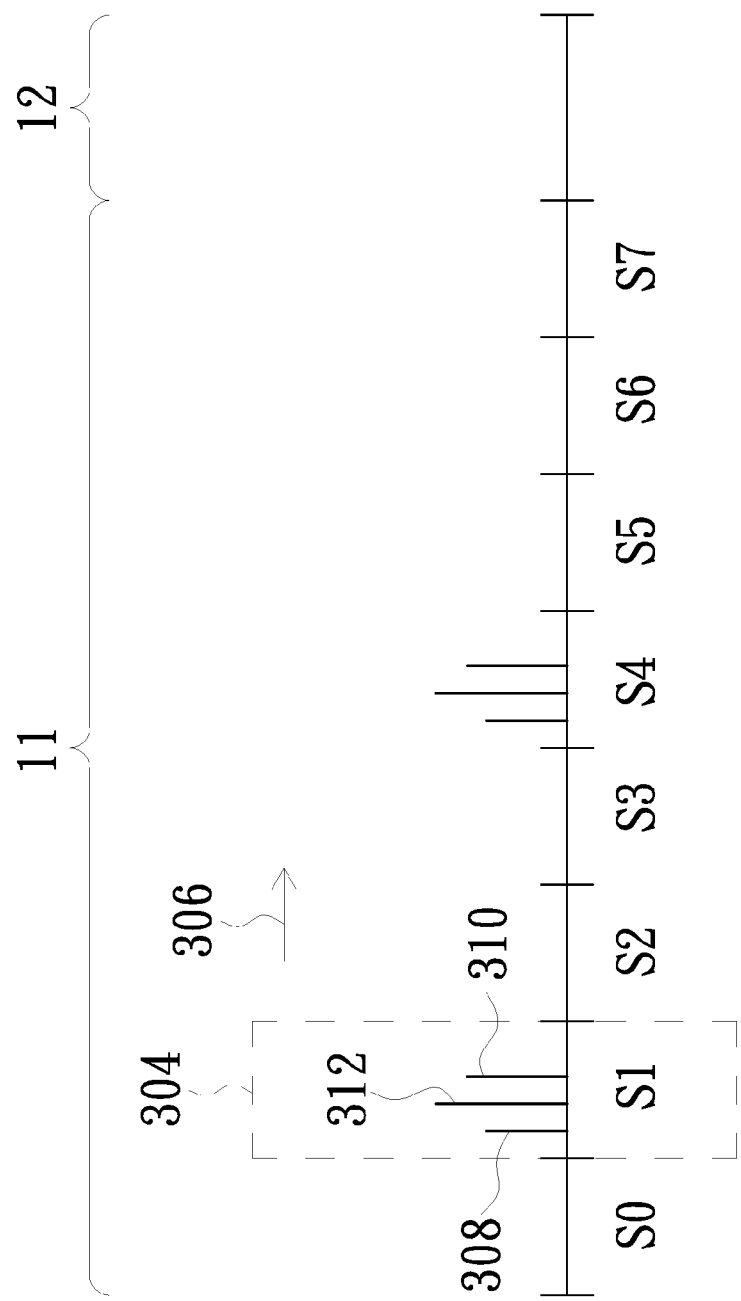
FIG. 6 is a schematic illustration of another exemplary distribution of a portion of bad data columns.
Figure 7:
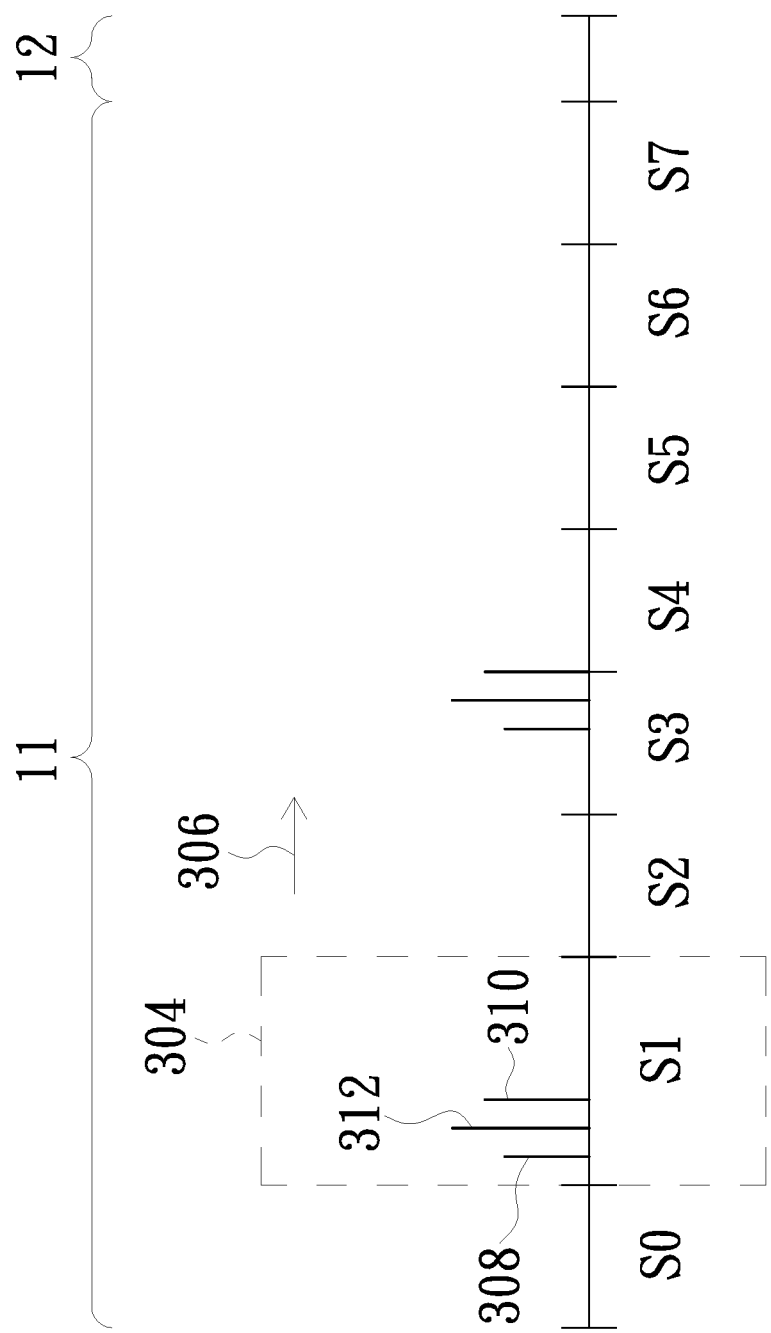
FIG. 7 is a schematic illustration of another exemplary distribution of a portion of bad data columns.

FIG. 6 is a schematic illustration of an exemplary distribution of a portion of bad data columns derived from the aforementioned second way of data division (i.e., the data storage medium 10 is divided into the data area 11 and the spare area 12 before the method for screening bad columns of the present invention is performed). In the present embodiment as illustrated in FIG. 6, the data area 11 is divided into eight segments (i.e., M=8), which are segments S0, S1, S2, S3, S4, S5, S6 and S7. Each one of the segments includes five columns (i.e., Y=5); wherein the columns 308, 310 and 312 are located in the segment S1. Because the control unit will not access the columns in the bad column interval once the bad column interval in the segment S1 is labeled and the control unit can adjust the sizes of the data area 11 and the spare area 12 according to user's need, the method for screening bad columns of the present invention can re-divide the columns into a plurality of segments; wherein each one of the new divided segments still has five normal data columns after the labeled bad data columns are deducted. FIG. 7 is a schematic illustration of an exemplary distribution of a portion of bad data columns after the columns are re-divided. As shown, because of the original segment S1 has a bad column interval (or, three bad columns 308, 310 and 312) as illustrated in FIG. 6, the rear end of the segment S1 is shifted three columns in a direction toward the rear end of the page thereby maintaining the segment S1 still having five normal columns after the bad column interval (or, the three bad columns 308, 310 and 312) is deducted. Because the rear end of the segment S1 is shifted three columns in a direction toward the rear end of the page, the segments S2-S7 are shifted three columns in a direction toward the rear end of the page accordingly; and therefore, the number of columns in the new divided spare area 12 in FIG. 7 is three less than the original spare area 12 in FIG. 6.

In another embodiment, if the number of labeled bad columns is relatively large, the total number of segments in the page may be decreased in response to the user's demand rather than re-dividing the segments. For example, the total number of segments in the data area 11 may be decreased to 7 from 8 (e.g., the segment S7 is erased); wherein the spare are 12 still has a certain size so as to maintain its preset function.

Please refer to FIG. 7 again. The inspection window 304 (specifically, both of the front end and the rear end of the inspection window 304) is shifted in a direction toward the rear end of the page only when the start point and the terminal point of the bad column interval are determined and labeled, the rear end of the inspection window 304 is shifted (e.g. by three columns in the previous embodiment) in a direction toward the rear end of the page, step S205 is re-performed and the determination result obtained in step S206 is yes.

In addition, the bad columns can be labeled by various means, such as labeling each one of the bad columns individually; or, labeling a plurality of bad columns as a bad column group, wherein the start point and the length (i.e., the number of columns between the start pint and the terminal point) of the bad column interval; or, combining the mean of labeling each one of the bad columns individually and the mean of labeling a plurality of bad columns as a bad column group, for example, the upper limit of bad data columns (e.g., 128) may be used solely for recording individual bad data columns, while the upper limit of bad data column groups (e.g., 128) may be used solely for recording bad column groups consisting of consecutive bad columns.

In another embodiment, the total number of error bits can be replaced by the average of the numbers of error bits. This replacement is an alternative mathematics choice and the purpose of the present invention is still achieved without colorful modification; thus, no redundant detail is to be given herein.

Finally, to avoid the result of the method for screening bad columns of the present invention is affected by the conditions of the sample blocks (e.g., the sample blocks have too many or too few bad columns), the positions and the numbers of bad columns in the data storage medium 10 may be determined by performing the method for screening bad columns of the present invention on all of the sample blocks (e.g., four sample blocks) first, deducting the sample blocks having the largest number of error bits and the smallest number of error bits, and then performing the method for screening bad columns of the present invention on the remaining sample blocks (e.g., two sample blocks). Alternatively, the user can deduct the blocks having the number of bad columns greater than a threshold from the sample blocks, thereby preventing the result of the method for screening bad columns of the present invention from being affected by the conditions of the sample blocks.

In summary, by employing the inspection window to determine the start point and the terminal point of the bad column interval, the method for screening bad columns of the present invention can reserve those columns which may be labeled as bad columns in the prior art; as a result, valid capacity in the data storage medium of the present invention can be maximized.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for screening bad columns in a data storage medium, wherein the data storage medium comprises a plurality of blocks, each of the plurality of blocks comprises a plurality of columns, and the method for screening bad columns comprises steps of:

writing predetermined data into one or more sample block, wherein the one or more sample block is selected from the plurality of blocks;

reading the one or more sample block to obtain written data;

comparing the written data with the predetermined data to calculate a plurality of numbers of error bits in the plurality of columns in the one or more sample block;

defining an inspection window covering a portion of the plurality of columns;

summing the numbers of error bits in the portion of the plurality of columns covered by the inspection window to obtain a total number of error bits and determining whether the total number of error bits is greater than a number of correctable bits;

if yes, determining a start point and a terminal point of a bad column interval in the inspection window, wherein the numbers of error bits in the columns between the start point and the terminal point are greater than or equal to a threshold of error bits; and labeling the columns in the bad column interval as bad columns.

2. The method for screening bad columns according to claim 1, further comprises a step of:

shifting the inspection window.

3. The method for screening bad columns according to claim 2, wherein the step of shifting the inspection window further comprises a step of:

shifting the inspection window in a first direction one column at a time.

4. The method for screening bad columns according to claim 1, wherein the number of correctable bits is not greater than a maximum number of correctable bits of an error correcting code (ECC).

5. The method for screening bad columns according to claim 1, wherein the threshold of error bits is associated with a maximum number of correctable bits of an ECC.

6. The method for screening bad columns according to claim 1, wherein a size of the inspection window is not greater than a size of a segment in the plurality of blocks, and the segment covers the portion of the plurality of columns in the one or more sample block.

7. The method for screening bad columns according to claim 1, wherein the step of labeling the columns in the bad column interval as bad columns is to label the starting point and the terminal point of the bad column interval.

8. The method for screening bad columns according to claim 1, wherein the step of labeling the columns in the bad column interval as bad columns is to label the starting point and a number of columns between the starting point and the terminal point.

9. A method for screening bad columns in a data storage medium, wherein the data storage medium comprises a plurality of blocks, each of the blocks comprises a plurality of columns, the plurality of columns are divided into a data area and a spare area, the data area comprises a plurality of segments, and the method for screening bad column comprises steps of:

writing predetermined data into one or more sample block, wherein the one or more sample block is selected from the plurality of blocks;

reading the one or more sample block to obtain written data;

comparing the written data with the predetermined data to calculate a plurality of numbers of error bits in the columns in the one or more sample block;

defining an inspection window, wherein a size of the inspection window is not greater than a size of one of the segments, the segments cover the portion of the plurality of columns in the one or more sample block;

summing the numbers of error bits in a plurality of columns covered by the inspection window to obtain a total number of error bits and determining whether the total number of error bits is greater than a number of correctable bits;

if yes, determining a start point and a terminal point of a bad column interval in the inspection window, wherein the numbers of error bits in the columns between the start point and the terminal point are greater than or equal to a threshold of error bits;

labeling the columns in the bad column interval as bad columns; and shifting the inspection window.

10. The method for screening bad columns according to claim 9, wherein the number of correctable bits is not greater than a maximum number of correctable bits of an error correcting code (ECC).

11. The method for screening bad columns according to claim 9, wherein the threshold of error bits is associated with a maximum number of correctable bits of an ECC.

12. The method for screening bad columns according to claim 9, wherein the step of shifting the inspection window further comprises a step of:

shifting the inspection window in a first direction one column at a time.

13. The method for screening bad columns according to claim 9, wherein the step of labeling the columns in the bad column interval as bad columns is to label the starting point and terminal point of the bad column interval.

14. The method for screening bad columns according to claim 9, wherein the step of labeling the columns in the bad column interval as bad columns is to label the starting point and a number of columns between the starting point and the terminal point.

15. A method for screening bad columns in a data storage medium, wherein the data storage medium comprises a plurality of blocks, each of the blocks comprises a plurality of columns, each of the columns is for storing a plurality of information of bits, and the method for screening bad column comprises steps of:

writing predetermined data into a plurality of sample blocks, wherein the plurality of sample blocks are selected from the plurality of blocks;

reading the sample blocks to obtain written data;

comparing the written data with the predetermined data to calculate a plurality of numbers of error bits in the columns in the plurality of sample blocks;

defining an inspection window to cover a portion of the columns;

summing the numbers of error bits in a plurality of columns covered by the inspection window to obtain a total number of error bits and determining whether the total number of error bits is greater than a number of correctable bits;

if yes, determining a start point and a terminal point of a bad column interval in the inspection window, wherein the numbers of error bits in the columns between the start point and the terminal point are greater than or equal to a threshold of error bits;

labeling the columns in the bad column interval as bad columns; and shifting the inspection window.

16. The method for screening bad columns according to claim 15, wherein a size of the inspection window is not greater than a size of a segment of the sample blocks, and the segment covers the portion of the plurality of columns in the one or more sample block.

17. The method for screening bad columns according to claim 15, wherein the number of correctable bits is not greater than a maximum number of correctable bits of an error correcting code (ECC).

18. The method for screening bad columns according to claim 15, wherein the threshold of error bits is associated with a maximum number of correctable bits of an ECC.

19. The method for screening bad columns according to claim 15, wherein the step of shifting the inspection window further comprises a step of:

shifting the inspection window in a first direction one column at a time.

\* \* \* \* \*